(12) United States Patent
Asai et al.

(10) Patent No.: US 11,923,284 B2
(45) Date of Patent: Mar. 5, 2024

(54) WIRING SUBSTRATE AND ELECTRONIC MODULE

(71) Applicant: Murata Manufacturing Co., Ltd., Kyoto (JP)

(72) Inventors: Ryota Asai, Kyoto (JP); Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 45 days.

(21) Appl. No.: 16/585,180

(22) Filed: Sep. 27, 2019

(65) Prior Publication Data

US 2020/0027825 A1  Jan. 23, 2020

Related U.S. Application Data

(63) Continuation of application No. PCT/JP2018/011943, filed on Mar. 24, 2018.

(30) Foreign Application Priority Data

Mar. 27, 2017 (JP) ................................. 2017-061949

(51) Int. Cl.
 *H05K 1/14* (2006.01)
 *H01L 21/48* (2006.01)
 (Continued)

(52) U.S. Cl.
 CPC .... *H01L 23/49838* (2013.01); *H01L 21/4857* (2013.01); *H01L 23/49822* (2013.01);
 (Continued)

(58) Field of Classification Search
 CPC ........... H01L 23/49838; H01L 21/4857; H01L 23/49822; H01L 25/16; H01L 23/50;
 (Continued)

(56) References Cited

U.S. PATENT DOCUMENTS 4,490,690 A * 12/1984 Suzuki .................... H01P 3/085
 174/117 FF
2002/0003557 A1 * 1/2002 Miyakoshi ........... B41J 2/14072
 347/58
(Continued)

FOREIGN PATENT DOCUMENTS

CN  101053287 A  10/2007
JP  H06-62570 A   9/1994
(Continued)

OTHER PUBLICATIONS

English Translation JP2001-085801 (Year: 2001).*
(Continued)

*Primary Examiner* — Steven T Sawyer
(74) *Attorney, Agent, or Firm* — Pearne & Gordon LLP

(57) ABSTRACT

A wiring substrate that is provided enables stray capacitance between a first electrode and a second electrode to be prevented from varying when an undulation occurs in the wiring substrate. Insulating layers are stacked. A first electrode and a second electrode are formed between the same layers at an interval. The thickness of the first electrode is more than the thickness of the second electrode. The lower main surface of the first electrode is located at a position lower than the lower main surface of the second electrode, and the upper main surface of the first electrode is located at a position higher than the upper main surface of the second electrode when seen through in a direction perpendicular to a stacking direction of the insulating layers.

11 Claims, 12 Drawing Sheets

(51) Int. Cl.
*H01L 23/498* (2006.01)
*H01L 25/16* (2023.01)
*H05K 1/02* (2006.01)
*H05K 1/16* (2006.01)
*H05K 1/18* (2006.01)

(52) U.S. Cl.
CPC .............. *H01L 25/16* (2013.01); *H05K 1/02*
(2013.01); *H05K 1/14* (2013.01); *H05K 1/16*
(2013.01); *H05K 1/18* (2013.01)

(58) Field of Classification Search
CPC .. H05K 1/14; H05K 1/18; H05K 1/02; H05K
1/16; H05K 3/46; H05K 2201/09736;
H05K 1/0306; H05K 1/0263; H05K
1/0298; H05K 1/0245
USPC ................................................ 174/250–268
See application file for complete search history.

(56) References Cited

U.S. PATENT DOCUMENTS

| 2004/0124493 | A1* | 7/2004 | Chua | H05K 1/162 |
| | | | | 257/508 |
| 2005/0263320 | A1 | 12/2005 | Igarashi | |
| 2006/0081990 | A1* | 4/2006 | Hsu | H01L 23/49822 |
| | | | | 257/E23.062 |
| 2006/0083895 | A1* | 4/2006 | Ikeda | B32B 7/02 |
| | | | | 428/137 |
| 2007/0248802 | A1 | 10/2007 | Saito et al. | |
| 2008/0080155 | A1* | 4/2008 | Ye | H05K 1/0248 |
| | | | | 361/777 |
| 2009/0316300 | A1* | 12/2009 | Kamei | H05K 1/0237 |
| | | | | 360/110 |
| 2015/0245469 | A1* | 8/2015 | Hanazaki | H05K 3/102 |
| | | | | 174/254 |

FOREIGN PATENT DOCUMENTS

| JP | H09-237955 A | 9/1997 |
| JP | 2001-085801 A | 3/2001 |
| JP | 2005-347354 A | 12/2005 |
| JP | 2013-062293 A | 4/2013 |

OTHER PUBLICATIONS

English Translation JP2013-062293 (Year: 2013).*
Dr. William G. Duff, Designing Electronic Systems for EMC: Grounding for the Control of EMI, 2011 (Year: 2011).*
International Search Report for PCT/JP2018/011943 dated Jun. 12, 2018.
Written Opinion for PCT/JP2018/011943 dated Jun. 12, 2018.

* cited by examiner

WIRING SUBSTRATE AND ELECTRONIC MODULE

This is a continuation of International Application No. PCT/JP2018/011943 filed on Mar. 24, 2018 which claims priority from Japanese Patent Application No. 2017-061949 filed on Mar. 27, 2017. The contents of these applications are incorporated herein by reference in their entireties.

BACKGROUND

Technical Field

The present disclosure relates to a wiring substrate in which at least a first electrode and a second electrode are formed between the same insulating layers.

The present disclosure also relates to an electronic module in which an electronic component is mounted on the wiring substrate according to the present disclosure.

Patent Document 1 (Japanese Unexamined Utility Model Registration Application Publication No. 6-62570) discloses a wiring substrate in which insulating layers are stacked, and electrodes are formed between the insulating layers.

FIG. 14 illustrates a wiring substrate (multilayer substrate containing a capacitor) 1000 disclosed in Patent Document 1. FIG. 14 is an exploded perspective view of the wiring substrate 1000.

The wiring substrate 1000 includes insulating layers (dielectric layers) 101a to 101d that are stacked. Insulating layers (insulating protection sheets) 102a and 102b that serve as protection layers are stacked on upper and lower surfaces of a stack of the insulating layers 101a to 101d.

A capacitor electrode (large-area capacitance electrode) 103 is formed on the upper main surface of the insulating layer 101a. A capacitor electrode (small-area capacitance electrode) 104 is formed on the upper main surface of the insulating layer 101b. A capacitor electrode (large-area capacitance electrode) 105 is formed on the upper main surface of the insulating layer 101c. A capacitor electrode (small-area capacitance electrode) 106 is formed on the upper main surface of the insulating layer 101d.

The capacitor electrode 103 and the capacitor electrode 105 of the wiring substrate 1000 have the same shape and the same size. The capacitor electrode 104 and the capacitor electrode 106 have the same shape and the same size. The size of the capacitor electrodes 103 and 105 is larger than the size of the capacitor electrodes 104 and 106.

Outer edges of the capacitor electrodes 104 and 106 are within outer edges of the capacitor electrodes 103 and 105 when seen through in a stacking direction of the insulating layers 101a to 101d. The capacitor electrodes 103 to 106 overlap.

The wiring substrate 1000 includes a capacitor that is formed by capacitance between the capacitor electrodes 103 and 105 and the capacitor electrodes 104 and 106.

The capacitance of the capacitor of the wiring substrate 1000 with the above structure does not vary even when one or some of the insulating layers 101a to 101d are misaligned in the stack in a plane direction.

That is, even when the insulating layers 101a to 101d are misaligned in the stack, overlapping areas of the capacitor electrodes 103 and 105 and the capacitor electrodes 104 and 106 do not vary, and the capacitance of the capacitor does not vary, because the size of the capacitor electrodes 103 and 105 of the wiring substrate 1000 is larger than the size of the capacitor electrodes 104 and 106, and the outer edges of the capacitor electrodes 104 and 106 are within the outer edges of the capacitor electrodes 103 and 105 when seen through in the stacking direction of the insulating layers 101a to 101d as described above, provided that the outer edges of the capacitor electrodes 104 and 106 do not project from the outer edges of the capacitor electrodes 103 and 105.

Even when one or some of the insulating layers 101a to 101d are misaligned in the stack in the plane direction, the capacitance of the capacitor of the wiring substrate 1000 does not vary, provided that the misalignment in the stack is within a permissible range. Accordingly, the defect rate of the wiring substrate 1000 caused when the capacitance of the capacitor is nonstandard is extremely low, the yield thereof is high, and the productivity thereof is high.

Patent Document 1: Japanese Unexamined Utility Model Registration Application Publication No. 6-62570

BRIEF SUMMARY

The wiring substrate 1000 enables the capacitance of the capacitor to be prevented from varying due to the misalignment of the insulating layers 101a to 101d in the stack. However, when an undulation occurs in the wiring substrate 1000, stray capacitance between two electrodes that are formed between the same layers and that are adjacent to each other cannot be prevented from varying.

That is, a wiring substrate that is recently designed to have high precision has a problem in that stray capacitance between two electrodes that are formed between the same layers and that are adjacent to each other varies (decreases) when an undulation occurs in the wiring substrate. The undulation is a phenomenon in which a part of the wiring substrate rises or sinks in the thickness direction. For example, in some cases where the wiring substrate is composed of ceramics, the undulation occurs in the wiring substrate due to firing unevenness during firing.

Originally, there can be no stray capacitance between the two electrodes that are formed between the same layers and that are adjacent to each other. However, in the case where the two electrodes are formed so as to approximate to each other between the same layers, the stray capacitance inevitably occurs between the two electrodes. For a wiring substrate that is recently designed to have high precision, the stray capacitance between the two electrodes that are adjacent to each other between the same layers is calculated to design the electrical characteristics of the wiring substrate. However, there is a problem in that, when the undulation occurs in the wiring substrate, the areas of facing portions of the two electrodes that are adjacent to each other between the same layers vary, and the stray capacitance between the two electrodes varies. There is also a problem in that the variation in the stray capacitance between the two electrodes causes the electrical characteristics of the wiring substrate to vary.

The wiring substrate 1000 enables the capacitance of the capacitor to be prevented from varying due to the misalignment of the insulating layers 101a to 101d in the stack. However, when the undulation occurs in the wiring substrate 1000, the stray capacitance between the two electrodes that are formed between the same layers and that are adjacent to each other cannot be prevented from varying.

A wiring substrate according to the present disclosure is provided to solve the above existing problems. To this end, a wiring substrate according to the present disclosure includes insulating layers that are stacked, and an electrode that is formed between the insulating layers. A first electrode and a second electrode are formed between the same layers at an interval. A thickness of the first electrode is more than a thickness of the second electrode. A lower main surface of the first electrode is located at a position lower than a lower main surface of the second electrode, and an upper main surface of the first electrode is located at a position higher than an upper main surface of the second electrode in a stacking direction (a direction perpendicular to a main surface of the insulating layers) of the insulating layers when seen through in a direction perpendicular to the stacking direction of the insulating layers.

The first electrode can be an electrode selected from, for example, an inductor electrode, a capacitor electrode, a wiring electrode, and a ground electrode. The second electrode can be an electrode selected from, for example, an inductor electrode, a capacitor electrode, a wiring electrode, and a ground electrode. The kind of the first electrode may be the same as the kind of the second electrode or may differ therefrom. The inductor electrode means an electrode for forming an inductor. The capacitor electrode means an electrode for forming a capacitor. The wiring electrode means an electrode for connecting two or more points to each other. The ground electrode means an electrode that has ground potential. In some cases, the ground electrode doubles as the capacitor electrode.

Each of the insulating layers can be composed of, for example, ceramics. In some cases where the insulating layer is composed of ceramics, an undulation occurs in the wiring substrate due to firing unevenness during firing. However, the wiring substrate according to the present disclosure prevents stray capacitance between the first electrode and the second electrode from varying due to the undulation in the wiring substrate.

The area of the first electrode can be larger than the area of the second electrode when seen through in the stacking direction of the insulating layers. For example, in the case where the second electrode generates heat when energized, the use of this structure enables heat capacity of the first electrode to be increased in a manner in which the area of the first electrode that is thick is increased to increase the volume of the first electrode. Accordingly, heat that is generated by the second electrode can be absorbed by the first electrode, the heat can be dissipated through the first electrode, and the temperature of the second electrode can be prevented from being a high temperature.

Conversely, the area of the second electrode can be larger than the area of the first electrode when seen through in the stacking direction of the insulating layers. For example, the above structure can be used in the case where the first electrode is a wiring electrode or an inductor electrode, and the second electrode is a capacitor electrode. The use of the above structure decreases internal resistance because the first electrode is thick, and enables the loss of a signal that passes therethrough to be decreased. Since the area of the second electrode is large, the capacitance of a capacitor that is formed by using the second electrode can be increased.

A sectional shape of the first electrode, or the second electrode, or both can be a polygonal shape that has corners when seen through in the direction perpendicular to the stacking direction of the insulating layers. All of the corners have an obtuse angle. The use of this structure enables the loss of the signal that passes through each electrode to be decreased.

An electronic module can be manufactured by mounting an electronic component on the wiring substrate according to the present disclosure.

The wiring substrate according to the present disclosure enables the stray capacitance between the first electrode and the second electrode to be prevented from varying when the undulation occurs in the wiring substrate. Accordingly, the electrical characteristics are prevented from varying when the undulation occurs in the wiring substrate.

The electronic module according to the present disclosure, which uses the wiring substrate according to the present disclosure, enables the electrical characteristics to be prevented from varying when the undulation occurs in the wiring substrate.

DETAILED DESCRIPTION

Figure 1:
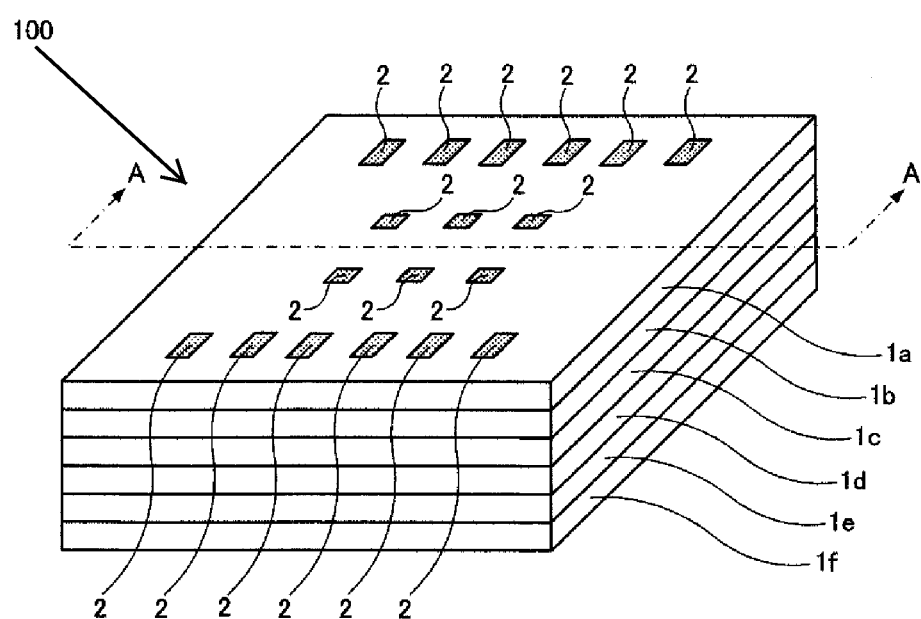
FIG. 1 is a perspective view of a wiring substrate 100 according to a first embodiment.

Embodiments for carrying out the present disclosure will hereinafter be described with reference the drawings.

The embodiments will be described by way of example as embodiments of the present disclosure, and the present disclosure is not limited to the embodiments. The contents described according to different embodiments can be combined and carried out. In this case, the contents to be carried out are included in the present disclosure. The drawings assist in understanding the description and are schematically illustrated in some cases. In some cases, the ratio of dimensions of a component or between components in the drawings does not match the ratio of the dimensions thereof in the description. In some cases, a component in the description is omitted in the drawings, and the number thereof is omitted in the drawings.

First Embodiment

Figure 2A:
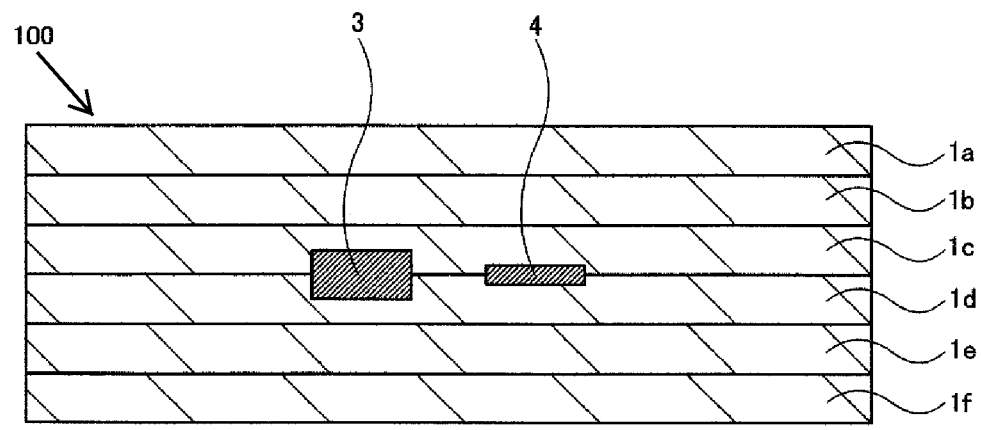
FIG. 2A is a sectional view of the wiring substrate 100 in which no undulation occurs.
Figure 2B:
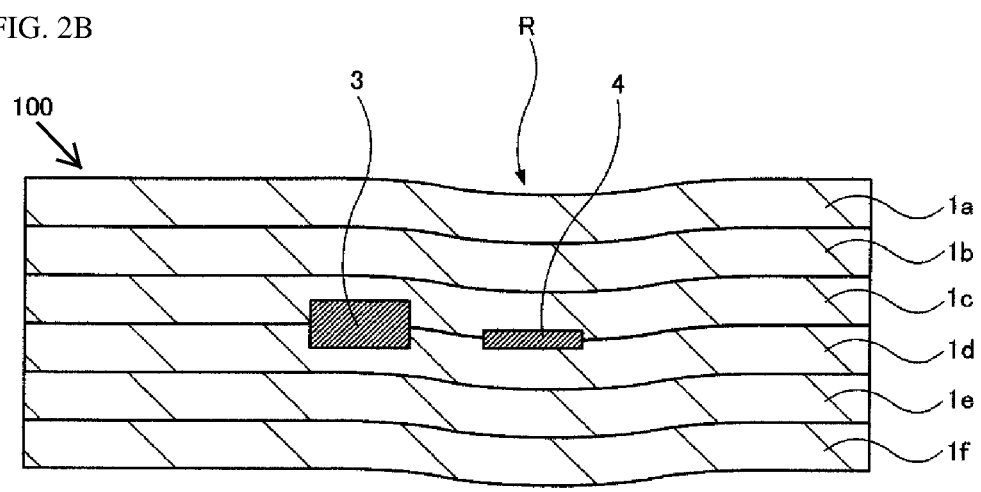
FIG. 2B is a sectional view of the wiring substrate 100 in which an undulation R occurs.

FIG. 1 and FIGS. 2A and 2B illustrate a wiring substrate 100 according to a first embodiment. FIG. 1 is a perspective view of the wiring substrate 100. FIG. 2A is a sectional view of the wiring substrate 100 and illustrates a portion taken along one-dot chain line A-A in FIG. 1. FIG. 2B is a sectional view of the wiring substrate 100 in which an undulation R occurs and illustrates the portion taken along one-dot chain line A-A in FIG. 1.

The wiring substrate 100 includes insulating layers 1a to 1f that are stacked and that are integrally formed. The insulating layers 1a to 1f are manufactured by using, for example, ceramics that can be fired at the same time as a conductive material for forming an electrode is fired.

Land electrodes 2 for mounting an electronic component are formed on the upper main surface of the insulating layer 1a. Each land electrode 2 is composed of a conductive material, and the main component of which is, for example, Cu or Ag. A single plating layer or plural plating layers composed of, for example, Ni, Au, or Sn are formed on a surface of the land electrode 2.

Mounting electrodes for mounting the wiring substrate 100 on, for example, a substrate of an electronic device are formed on the lower main surface of the insulating layer 1f, although an illustration thereof is omitted. Also, each mounting electrode is composed of a conductive material, and the main component of which is, for example, Cu or Ag. A single plating layer or plural plating layers composed of, for example, Ni, Au, or Sn are formed on a surface of the mounting electrode.

As illustrated in FIG. 2A, a first electrode 3 and a second electrode 4 are formed between the insulating layer 1c and the insulating layer 1d at an interval in the plane direction of the layers.

The thickness of the first electrode 3 is larger than the thickness of the second electrode 4. According to the present embodiment, the thickness of the first electrode 3 is 30 μm, and the thickness of the second electrode 4 is 10 μm.

The lower main surface of the first electrode 3 is located at a position lower than the lower main surface of the second electrode 4, and the upper main surface of the first electrode 3 is located at a position higher than the upper main surface of the second electrode 4, in the stacking direction of the insulating layers 1a to 1f when seen through in the direction perpendicular to the stacking direction of the insulating layers 1a to 1f (a direction parallel to a main surface of the insulating layer 1a and a direction perpendicular to a direction in which the first electrode 3 and the second electrode 4 are aligned). That is, the second electrode 4 is within the first electrode 3 when viewed in the thickness direction (in one embodiment, a direction parallel to the main surface of the insulating layer 1a and a direction perpendicular to a surface of the first electrode 3 facing a surface of the second electrode 4; in one embodiment, a direction parallel to the main surface of the insulating layer 1a and a direction in which the first electrode 3 and the second electrode 4 are aligned).

The first electrode 3 is an electrode selected from, for example, an inductor electrode, a capacitor electrode, a wiring electrode, and a ground electrode. Also, the second electrode 4 is an electrode selected from, for example, an inductor electrode, a capacitor electrode, a wiring electrode, and a ground electrode. The kind of the first electrode 3 may be the same as the kind of the second electrode 4 or may differ therefrom.

The first electrode 3 and the second electrode 4 are composed of a conductive material, and the main component of which is, for example, Cu or Ag.

In some cases, in the wiring substrate 100, another interlayer electrode other than the first electrode 3 and the second electrode 4 is formed between layers of the insulating layers 1a to 1f, although an illustration thereof is omitted. The other interlayer electrode is an electrode selected from, for example, an inductor electrode, a capacitor electrode, a wiring electrode, and a ground electrode. The other interlayer electrode is composed of a conductive material, and the main component of which is, for example, Cu or Ag.

In the wiring substrate 100, one or more via electrodes that extend between the upper main surface and the lower main surface are formed in the insulating layers 1a to 1f, although an illustration thereof is also omitted. Each via electrode is composed of a conductive material, and the main component of which is, for example, Cu or Ag.

In the wiring substrate 100, an inner wiring circuit is formed by interlayer electrodes including the first electrode 3 and the second electrode 4 and the via electrodes. The inner wiring circuit is electrically connected to the land electrodes 2 and the mounting electrodes.

The thickness of the first electrode 3 of the wiring substrate 100 is more than the thickness of the second electrode 4, the lower main surface of the first electrode 3 is located at a position lower than the lower main surface of the second electrode 4, and the upper main surface of the first electrode 3 is located at a position higher than the upper main surface of the second electrode 4, in the stacking direction of the insulating layers 1a to 1f when seen through in the direction perpendicular to the stacking direction of the insulating layers 1a to 1f, as described above. The wiring substrate 100 maintains the state described above even when the undulation occurs. Accordingly, the areas of facing portions of the first electrode 3 and the second electrode 4 of the wiring substrate 100 (a portion of the first electrode 3 that is overlapped with the second electrode 4 when viewed in the thickness direction (in one embodiment, the direction parallel to the main surface of the insulating layer 1a and a direction perpendicular to the surface of the first electrode 3 facing the surface of the second electrode 4; in one embodiment, the direction parallel to the main surface of the insulating layer 1a and a direction in which the first electrode 3 and the second electrode 4 are aligned)) do not vary even when the undulation occurs, and the magnitude of stray capacitance between the first electrode 3 and the second electrode 4 is prevented from varying.

Figure 3A:
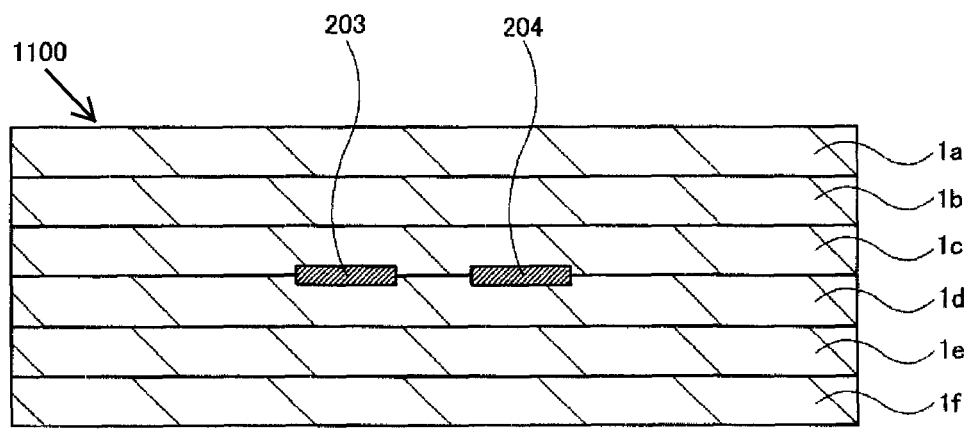
FIG. 3A is a sectional view of a wiring substrate 1100 in a comparative example in which no undulation occurs.

For comparison, a wiring substrate 1100 in a comparative example illustrated in FIG. 3A is manufactured. The thickness of a first electrode 203 and the thickness of a second electrode 204 of the wiring substrate 1100 are equal to each other. More specifically, the thickness of the first electrode 203 and the thickness of the second electrode 204 of the wiring substrate 1100 are 20 The other structure of the wiring substrate 1100 is the same as that of the wiring substrate 100.

Figure 3B:
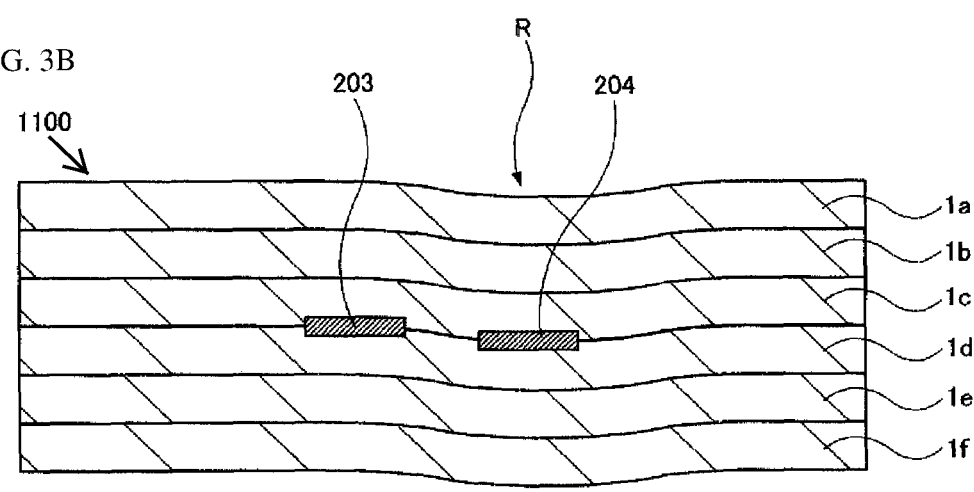
FIG. 3B is a sectional view of the wiring substrate 1100 in which the undulation R occurs.

FIG. 2B illustrates a state where the undulation R occurs in the wiring substrate 100 according to the first embodiment. FIG. 3B illustrates a state where the undulation R occurs in the wiring substrate 1100 in the comparative example. The undulation R described herein is caused when a part of each wiring substrate sinks in the thickness direction.

Figure 4A:
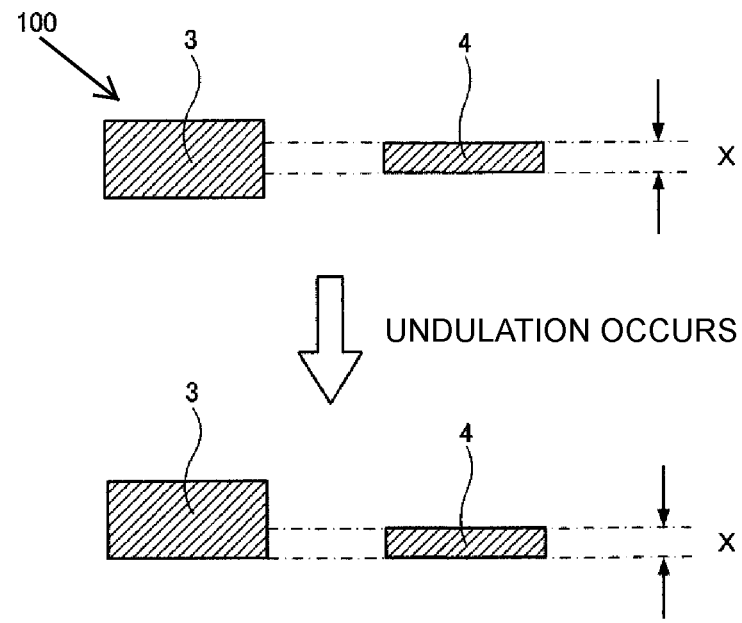
FIG. 4A illustrates a relationship of relative positions of a first electrode 3 and a second electrode 4 of the wiring substrate 100 between the case where no undulation occurs and the case where the undulation R occurs.
Figure 4B:
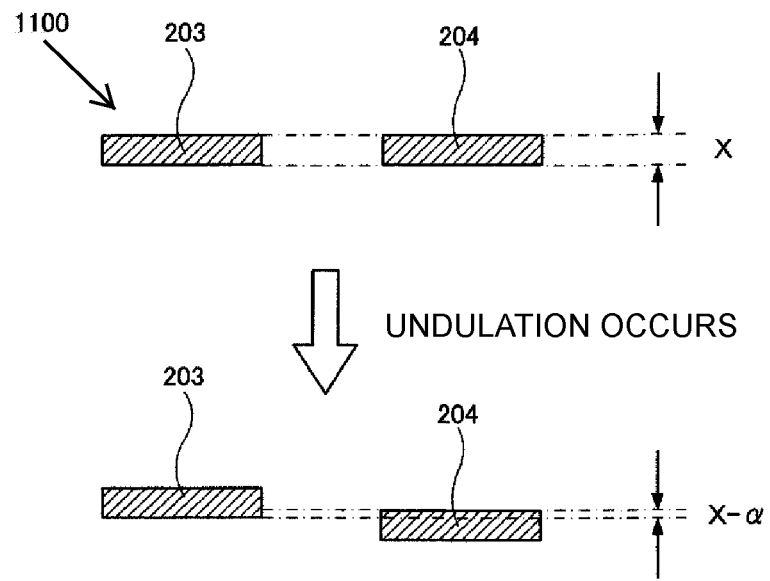
FIG. 4B illustrates a relationship of relative positions of a first electrode 203 and a second electrode 204 of the wiring substrate 1100 between the case where no undulation occurs and the case where the undulation R occurs.

FIG. 4A illustrates a relationship of relative positions of the first electrode 3 and the second electrode 4 of the wiring substrate 100 between the case where no undulation occurs and the case where the undulation R occurs. FIG. 4B illustrates a relationship of relative positions of the first electrode 203 and the second electrode 204 of the wiring substrate 1100 between the case where no undulation occurs and the case where the undulation R occurs.

As seen from FIG. 4A, the thickness X of the facing portions of the first electrode 3 and the second electrode 4 of the wiring substrate 100 is constant and does not vary in both of the cases where the undulation R does not occur and the undulation R occurs. That is, the areas of the facing portions of the first electrode 3 and the second electrode 4 of the wiring substrate 100 are constant and do not vary regardless of the presence or absence of the undulation R.

As illustrated in FIG. 4B, however, the thickness X of the facing portions of the first electrode 203 and the second electrode 204 of the wiring substrate 1100 in a state where the undulation R does not occur varies (decreases) to X—α when the undulation R occurs. That is, the areas of the facing portions of the first electrode 203 and the second electrode 204 of the wiring substrate 1100 vary (decreases) when the undulation R occurs.

The areas of the facing portions of the first electrode 3 and the second electrode 4 of the wiring substrate 100 do not vary even when the undulation R occurs. Accordingly, the stray capacitance between the first electrode 3 and the second electrode 4 is prevented from varying. However, the areas of the facing portions of the first electrode 203 and the second electrode 204 of the wiring substrate 1100 vary (decreases) when the undulation R occurs. Accordingly, the stray capacitance between the first electrode 203 and the second electrode 204 greatly varies (decreases).

The wiring substrate 100 according to the first embodiment prevents the stray capacitance between the first electrode 3 and the second electrode 4 from varying even when the undulation occurs, as described above.

Since the wiring substrate 100 according to the first embodiment prevents the stray capacitance from varying, the first electrode 3 and the second electrode 4 can be formed between the same layers so as to approximate to each other. This enables the size thereof in the plane direction to be prevented from being increased.

An example of a method of manufacturing the wiring substrate 100 will now be described.

A ceramic green sheet for forming the insulating layers 1a to 1f is first manufactured. In order to manufacture a number of the wiring substrates 100 collectively, the ceramic green sheet is manufactured as a mother ceramic green sheet in which ceramic green sheets are arranged in a matrix.

Specifically, an organic solvent, a resin material, and a ceramic material in a predetermined amount are mixed and kneaded to prepare ceramic slurry.

Subsequently, the ceramic slurry is applied to a resin film and dried to manufacture the mother ceramic green sheet.

Subsequently, a through-hole for forming a via conductor is formed in the mother ceramic green sheet. The through-hole is formed by, for example, a method of radiating a laser beam.

Subsequently, the through-hole that is formed in the mother ceramic green sheet is filled with conductive paste.

Subsequently, conductive paste is applied to a main surface of the mother ceramic green sheet by a method such as screen printing or ink-jet printing as need to form a conductive paste pattern for forming the interlayer electrodes including the first electrode 3 and the second electrode 4, the land electrodes 2, and the mounting electrodes.

Another special process is performed on a mother ceramic green sheet for forming the insulating layer 1d with the first electrode 3 and the second electrode 4 formed on the upper main surface.

Figure 5A:
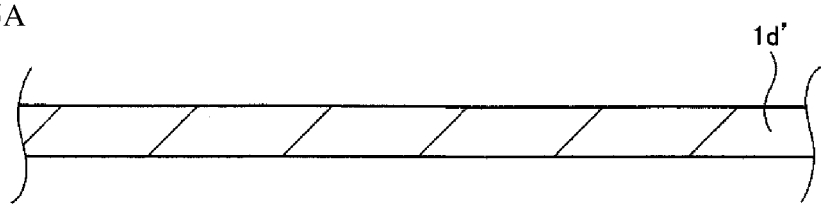
FIGS. 5A to 5F illustrate processes that are performed in an example of a method of manufacturing the wiring substrate 100 with sectional views.

As illustrated in FIG. 5A, a mother ceramic green sheet 1d' for forming the insulating layer 1d is prepared.

Figure 5B:
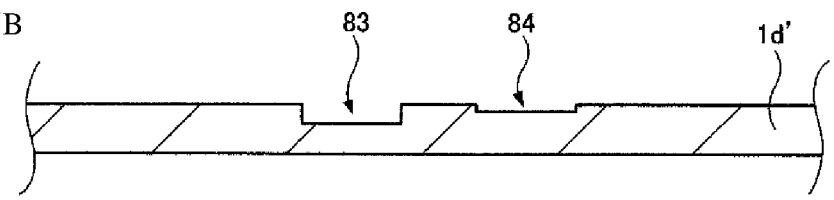

Subsequently, as illustrated in FIG. 5B, a deep groove 83 for forming the first electrode 3 that is thick and a shallow groove 84 for forming the second electrode 4 that is thin are formed on the upper main surface of the mother ceramic green sheet 1d'. The grooves 83 and 84 are formed by, for example, a method such as a laser beam radiation, cutting with a router, and pressing with a mold.

Figure 5C:
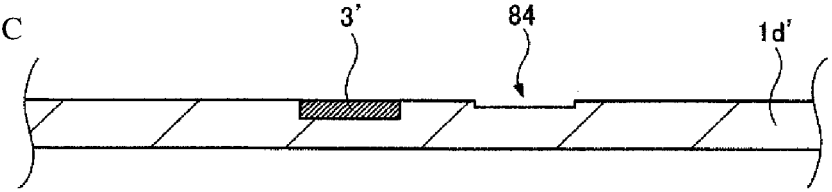

Subsequently, as illustrated in FIG. 5C, conductive paste 3' for forming the first electrode 3 is applied for the first time into the groove 83.

Figure 5D:
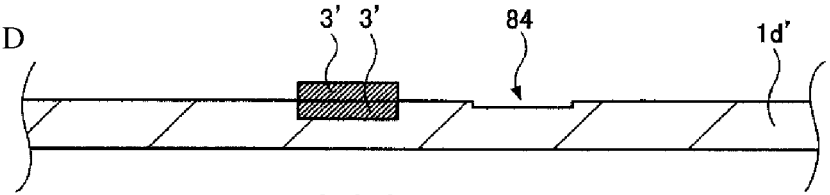

Subsequently, as illustrated in FIG. 5D, the conductive paste 3' is applied for the second time to the conductive paste 3' applied for the first time.

Figure 5E:
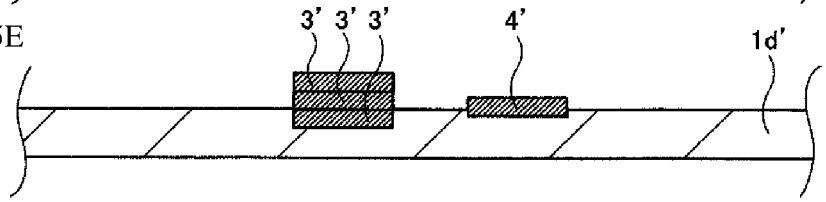

Subsequently, as illustrated in FIG. 5E, the conductive paste 3' is applied for the third time to the conductive paste 3' applied for the second time, and conductive paste 4' for forming the second electrode 4 is applied into the groove 84.

Figure 5F:
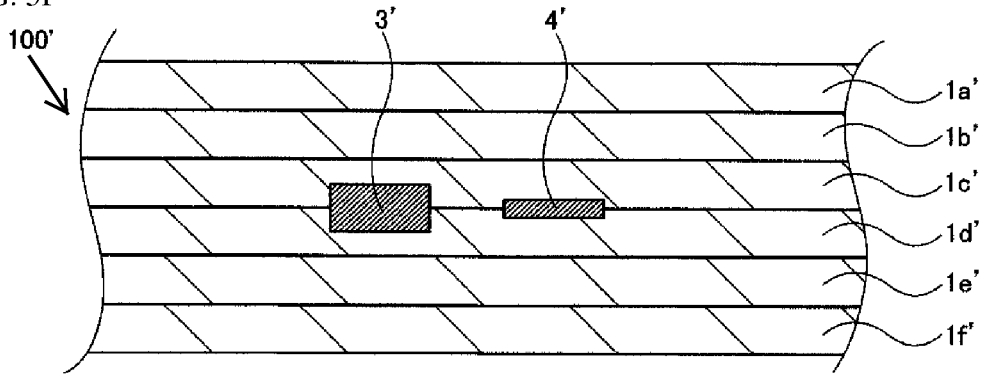

Subsequently, as illustrated in FIG. 5F, mother ceramic green sheets 1a' to 1f' for forming the insulating layers 1a to 1f, including the mother ceramic green sheet 1d' that undergoes the above processes, are stacked and pressed in the vertical direction while being heated to manufacture an unfired mother multilayer body 100'. At this time, the conductive paste 3' applied three times is integrally formed.

Subsequently, the unfired mother multilayer body 100' is divided to manufacture individual unfired multilayer bodies.

Subsequently, the unfired multilayer bodies are fired in a predetermined profile to manufacture a multilayer body in which the insulating layers 1a to 1f are stacked.

Finally, plating layers are formed on surfaces of the land electrodes 2 that are formed on the upper main surface of the insulating layer 1a and on surfaces of the mounting electrodes that are formed on the lower main surface of the insulating layer 1f by, for example, electroplating to complete the wiring substrate 100.

In the above method of manufacturing the wiring substrate 100, the conductive paste 3' for forming the first electrode 3 is applied three times, and the conductive paste 4' for forming the second electrode 4 is applied once. The number of times of the application can be increased or decreased depending on the desired thickness of the first electrode 3, and the desired thickness of the second electrode 4.

In the above method of manufacturing the wiring substrate 100, the groove 83 for forming the first electrode 3 and the groove 84 for forming the second electrode 4 are formed on the upper main surface of the mother ceramic green sheet 1d'. However, only the groove 83 for forming the first electrode 3 may be formed, the groove 84 for forming the second electrode 4 may not be formed, and the conductive paste 4' for forming the second electrode 4 may be applied to a flat portion of the upper main surface of the mother ceramic green sheet 1d' at which no groove is formed. Alternatively, no groove may be formed on the upper main surface of the mother ceramic green sheet 1d', and the number of times the conductive paste 3' is applied may be merely adjusted to be larger than the number of times the conductive paste 4' is applied. In this case, when the mother ceramic green sheets 1a' to 1f' are stacked and pressed in the vertical direction, the conductive paste 3' sinks more greatly than the conductive paste 4', and consequently, a predetermined positional relationship between the conductive paste 3' and the conductive paste 4' is created.

In the completed wiring substrate 100, the first electrode 3 that is thick and the second electrode 4 that is thin are formed between the insulating layer 1c and the insulating layer 1d at an interval.

Second Embodiment

Figure 6:
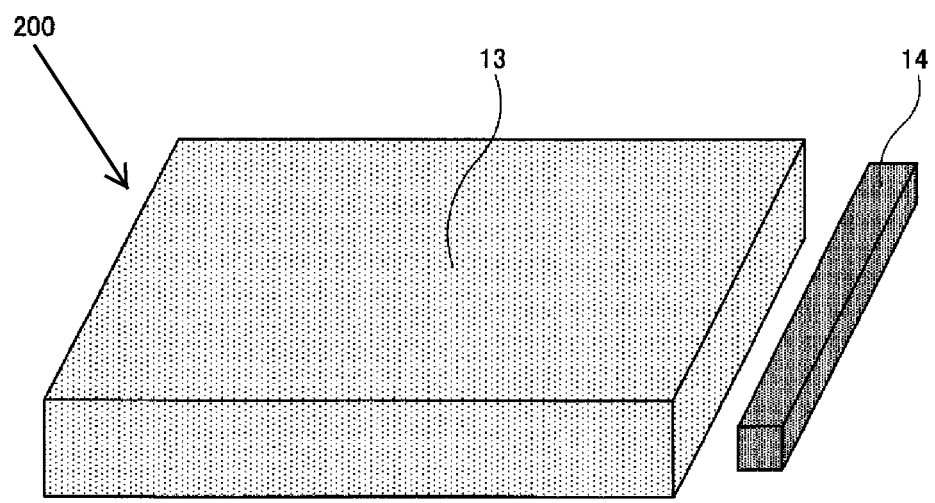
FIG. 6 is an exploded perspective view of a main part of a wiring substrate 200 according to a second embodiment.

FIG. 6 illustrates a wiring substrate 200 according to a second embodiment. FIG. 6 is an exploded perspective view of a main part of the wiring substrate 200 and illustrates only a first electrode 13 and a second electrode 14.

The wiring substrate 100 according to the first embodiment is partly modified into the wiring substrate 200 according to the second embodiment. Specifically, the area of the first electrode 3 and the area of the second electrode 4 of the wiring substrate 100 are equal to each other when seen through in the stacking direction of the insulating layers 1a to 1f. In the case of the wiring substrate 200, however, the area of the first electrode 13 that is thick is larger than the area of the second electrode 14 that is thin when seen through in the stacking direction of the insulating layers 1a to 1f. The other structure of the wiring substrate 200 is the same as that of the wiring substrate 100.

For example, this structure can be used in the case where the second electrode 14 generates heat when energized. That is, heat capacity of the first electrode 13 can be increased in a manner in which the area of the first electrode 13 that is thick is increased to increase the volume of the first electrode 13. Accordingly, the heat that is generated by the second electrode 14 can be absorbed by the first electrode 13, the heat can be dissipated through the first electrode 13, and the temperature of the second electrode 14 can be prevented from being a high temperature.

The areas of the facing portions of the first electrode 13 and the second electrode 14 of the wiring substrate 200 do not vary even when the undulation occurs as in the wiring substrate 100, and stray capacitance between the first electrode 13 and the second electrode 14 is prevented from varying.

Third Embodiment

Figure 7:
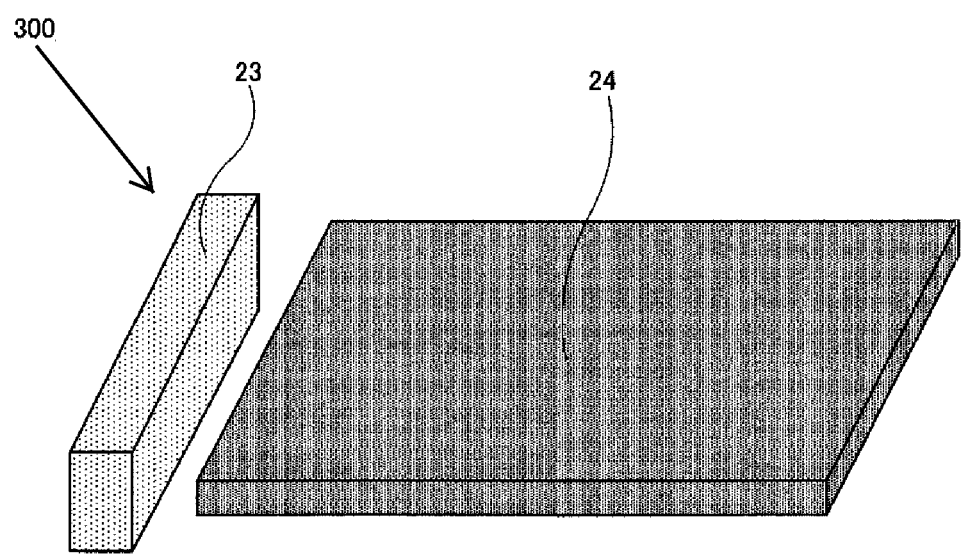
FIG. 7 is an exploded perspective view of a main part of a wiring substrate 300 according to a third embodiment.

FIG. 7 illustrates a wiring substrate 300 according to a third embodiment. FIG. 7 is an exploded perspective view of a main part of the wiring substrate 300 and illustrates only a first electrode 23 and a second electrode 24.

The wiring substrate 100 according to the first embodiment is also partly modified into the wiring substrate 300 according to the third embodiment. Specifically, the area of the first electrode 3 and the area of the second electrode 4 of the wiring substrate 100 are equal to each other when seen through in the stacking direction of the insulating layers 1a to 1f. In the case of the wiring substrate 300, however, the area of the second electrode 24 that is thin is larger than the area of the first electrode 23 that is thick when seen through in the stacking direction of the insulating layers 1a to 1f. The other structure of the wiring substrate 300 is the same as that of the wiring substrate 100.

For example, the structure of the wiring substrate 300 can be used in the case where the first electrode 23 is a wiring electrode or an inductor electrode, and the second electrode 24 is a capacitor electrode. The use of the structure of the wiring substrate 300 decreases internal resistance because the first electrode 23 is thick and enables the loss of a signal that passes therethrough to be decreased. However, since the area of the second electrode 24 is large, the capacitance of a capacitor that uses the second electrode 24 can be increased.

The areas of the facing portions of the first electrode 23 and the second electrode 24 of the wiring substrate 300 do not vary even when the undulation occurs, and stray capacitance between the first electrode 23 and the second electrode 24 is prevented from varying.

Fourth Embodiment

Figure 8:
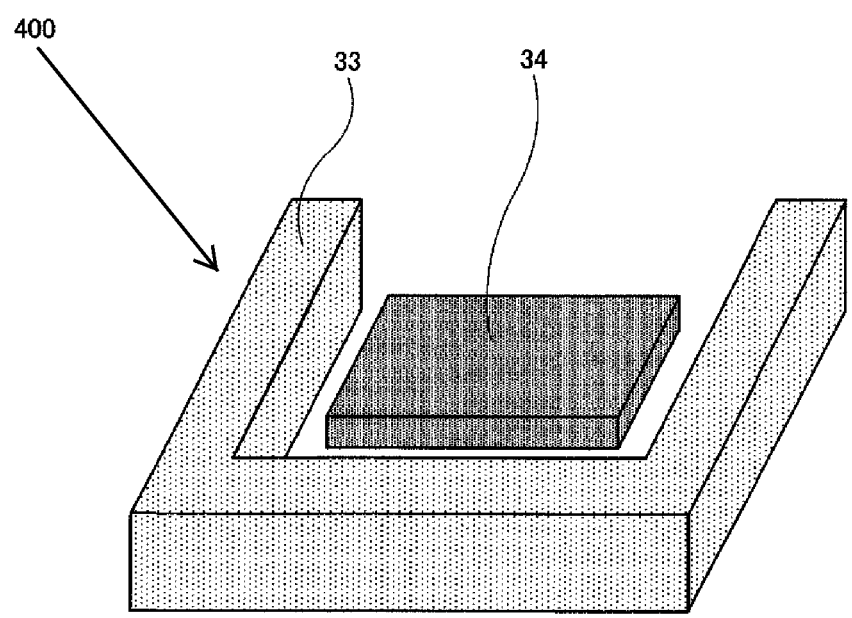
FIG. 8 is an exploded perspective view of a main part of a wiring substrate 400 according to a fourth embodiment.

FIG. 8 illustrates a wiring substrate 400 according to a fourth embodiment. FIG. 8 is an exploded perspective view of a main part of the wiring substrate 400 and illustrates only a first electrode 33 and a second electrode 34.

The wiring substrate 100 according to the first embodiment is also partly modified into the wiring substrate 400 according to the fourth embodiment. Specifically, the first electrode 3 and the second electrode 4 of the wiring substrate 100 are formed so as to extend in parallel to each other. In the wiring substrate 400, however, the first electrode 33 and the second electrode 34 are formed such that the first electrode 33 that is thick surrounds the second electrode 34 that is thin. The other structure of the wiring substrate 400 is the same as that of the wiring substrate 100.

The first electrode 33 is, for example, an inductor electrode or a wiring electrode. The second electrode 34 is, for example, a capacitor electrode or a ground electrode.

The areas of the facing portions of the first electrode 33 and the second electrode 34 of the wiring substrate 400 do not vary even when the undulation occurs, and stray capacitance between the first electrode 33 and the second electrode 34 is prevented from varying.

Fifth Embodiment

Figure 9:
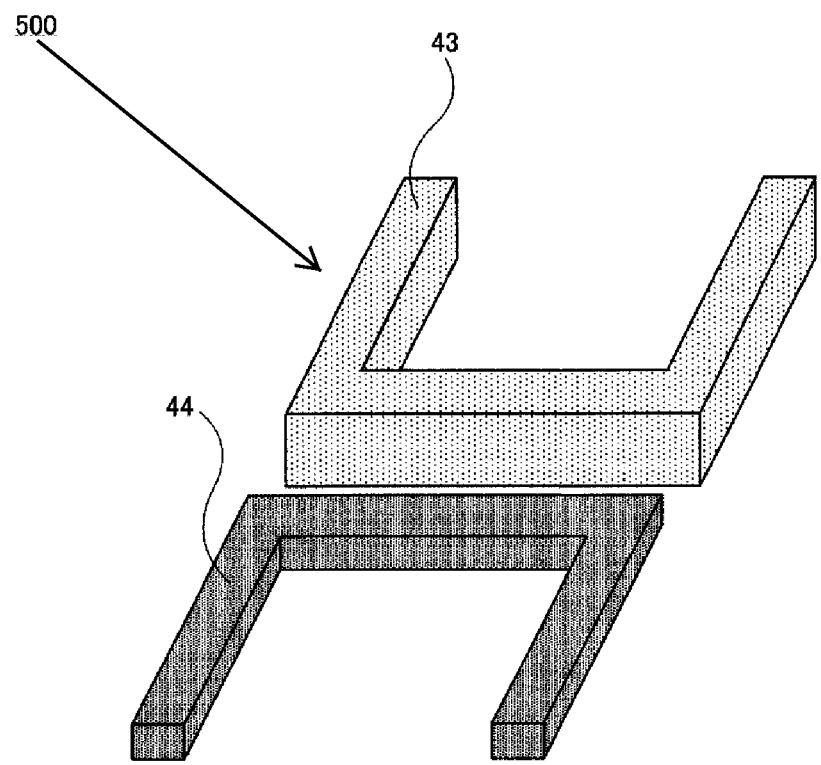
FIG. 9 is an exploded perspective view of a main part of a wiring substrate 500 according to a fifth embodiment.

FIG. 9 illustrates a wiring substrate 500 according to a fifth embodiment. FIG. 9 is an exploded perspective view of a main part of the wiring substrate 500 and illustrates only a first electrode 43 and a second electrode 44.

The wiring substrate 500 includes the first electrode 43 that is thick and the second electrode 44 that is thin. The first electrode 43 and the second electrode 44 are inductor electrodes. Electromagnetic field coupling between the first electrode 43 and the second electrode 44 occurs by energizing.

The areas of the facing portions of the first electrode 43 and the second electrode 44 do not vary even when the undulation occurs in the wiring substrate 500, and stray capacitance between the first electrode 43 and the second electrode 44 is prevented from varying. Accordingly, the wiring substrate 500 enables the first electrode 43 and the second electrode 44 to extremely approximate to each other and enables strong electromagnetic field coupling between the first electrode 43 and the second electrode 44 to occur by energizing.

Sixth Embodiment

Figure 10:
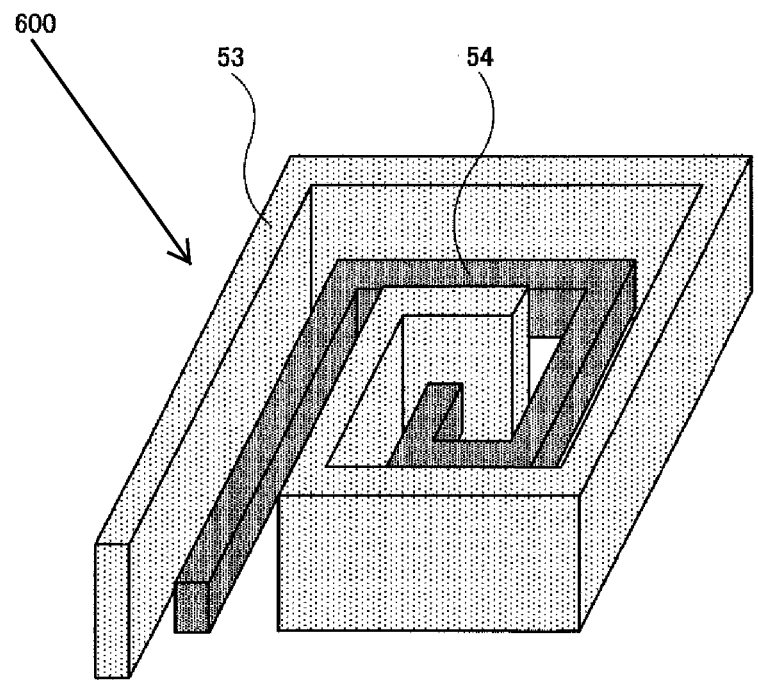
FIG. 10 is an exploded perspective view of a main part of a wiring substrate 600 according to a sixth embodiment.

FIG. 10 illustrates a wiring substrate 600 according to a sixth embodiment. FIG. 10 is an exploded perspective view of a main part of the wiring substrate 600 and illustrates only a first electrode 53 and a second electrode 54.

The wiring substrate 500 according to the fifth embodiment is modified into the wiring substrate 600 according to the sixth embodiment. Specifically, in the wiring substrate 500, the first electrode 43 that is an inductor electrode and that is thick and the second electrode 44 that is also an inductor electrode and that is thin are formed so as to face each other. In the wiring substrate 600, however, the first electrode 53 that is an inductor electrode and that is thick and the second electrode 54 that is also an inductor electrode and that is thin are spirally formed in parallel to each other.

When the first electrode 53 and the second electrode 54 of the wiring substrate 600 are energized, electromagnetic field coupling that occurs between the first electrode 53 and the second electrode 54 is stronger than the electromagnetic field coupling between the first electrode 43 and the second electrode 44 of the wiring substrate 500 according to the fifth embodiment.

Seventh Embodiment

Figure 11:
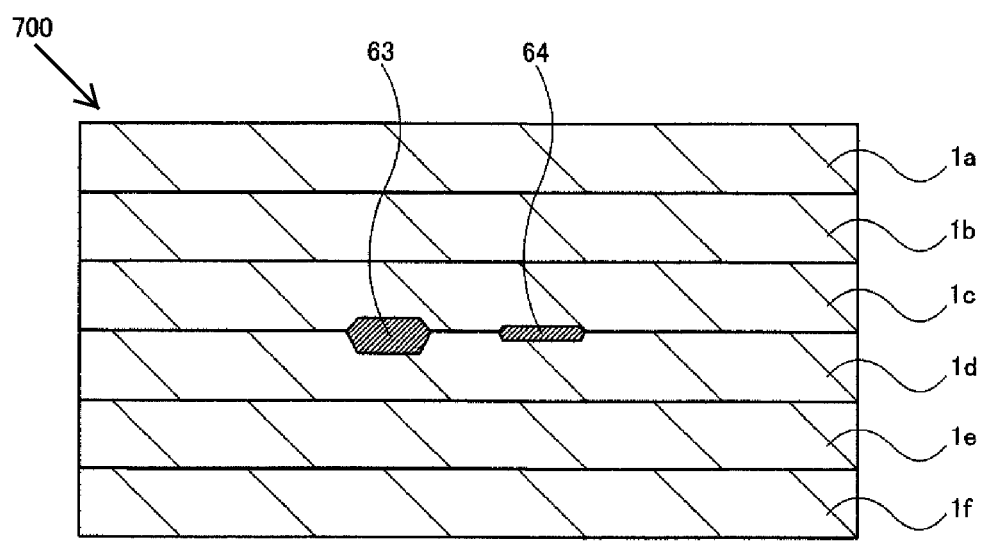
FIG. 11 is an exploded perspective view of a main part of a wiring substrate 700 according to a seventh embodiment.

FIG. 11 illustrates a wiring substrate 700 according to a seventh embodiment. FIG. 11 is a sectional view of the wiring substrate 700.

The wiring substrate 100 according to the first embodiment is also partly modified into the wiring substrate 700 according to the seventh embodiment. Specifically, a sectional shape of the first electrode 3 and a sectional shape of the second electrode 4 of the wiring substrate 100 are rectangular shapes when seen through in the direction perpendicular to the stacking direction of the insulating layers 1a to 1f. The corners of rectangles have a right angle. In the case of the wiring substrate 700, however, a sectional shape of a first electrode 63 that is thick and a sectional shape of a second electrode 64 that is thin are hexagonal shapes when seen through in the direction perpendicular to the stacking direction of the insulating layers 1a to 1f. The corners of the section of the first electrode 63 and the corners of the section of the second electrode 64 have an obtuse angle. The other structure of the wiring substrate 700 is the same as that of the wiring substrate 100.

In the case where a radio frequency signal passes through an electrode, an electric current concentrates on an acute-angle corner due to skin effect, and a circuit resistance value increases. Accordingly, the loss of the signal decreases as the number of polygonal corners of the section of the electrode increases such as from a pentagon to a hexagon and to a heptagon unlike the right-angle corners of the section of the electrode. When the sectional shape of the electrode is a circular shape, the loss of the signal is the minimum. The loss of the signal decreases as the angle of each corner of the section of the electrode increases.

In view of this, the sectional shape of the first electrode 63 and the sectional shape of the second electrode 64 of the wiring substrate 700 are hexagonal shapes, and the corners of the section of the first electrode 63 and the corners of the section of the second electrode 64 have an obtuse angle. This decreases the loss of the signal when the radio frequency signal passes through the first electrode 63 and the second electrode 64.

The first electrode 63 and the second electrode 64 of the wiring substrate 700 can be formed by partly modifying the above method of manufacturing the wiring substrate 100 according to the first embodiment. This will now be simply described.

Figure 12A:
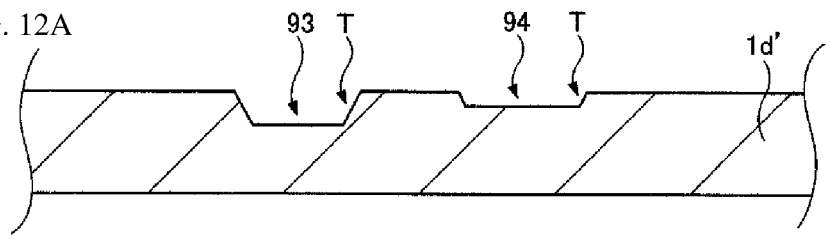
FIGS. 12A to 12E illustrate processes that are performed in an example of a method of manufacturing the wiring substrate 700 with sectional views.

As illustrated in FIG. 12A, a deep groove 93 for forming the first electrode 63 that is thick and a shallow groove 94 for forming the second electrode 64 that is thin are first formed on the upper main surface of the mother ceramic green sheet 1d'. At this time, tapers T are formed on side walls of the grooves 93 and 94 so as to be inclined.

Figure 12B:
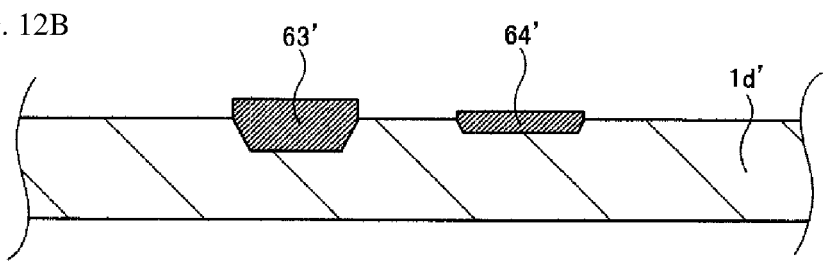

Subsequently, as illustrated in FIG. 12B, conductive paste 63' for forming the first electrode 63 is applied into the groove 93, and conductive paste 64' for forming the second electrode 64 is applied into the groove 94. At this time, the conductive paste is repeatedly applied such that the thickness of the conductive paste 63' and the thickness of the conductive paste 64' are predetermined thicknesses.

Figure 12C:
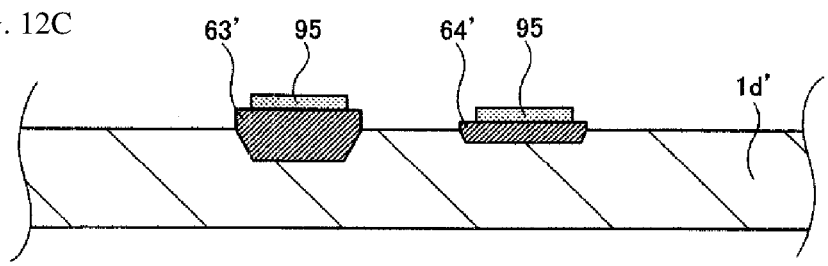

Subsequently, as illustrated in FIG. 12C, resists 95 are formed on the conductive paste 63' and the conductive paste 64' except for on both of shoulder portions.

Figure 12D:
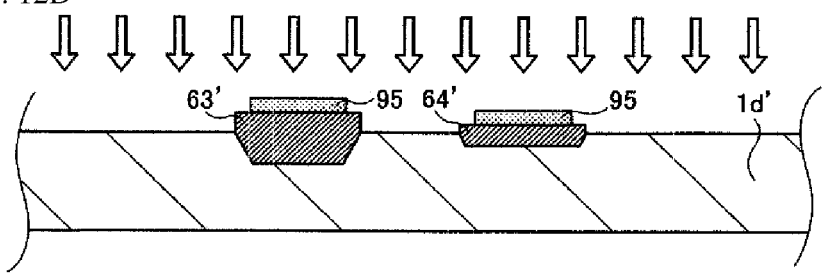

Subsequently, as illustrated in FIG. 12D, both of the shoulder portions of the conductive paste 63' and 64' are removed by a method such as dry blasting, wet blasting, dry etching, or wet etching.

Figure 12E:
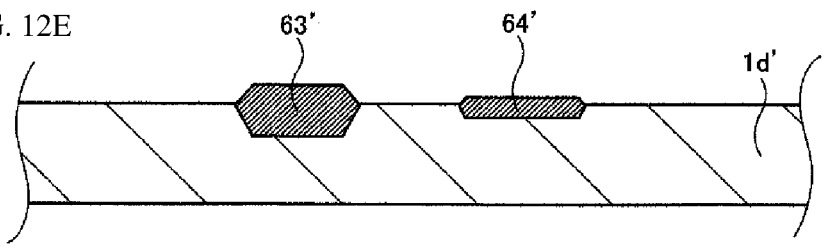

Subsequently, the resists 95 are removed. Consequently, as illustrated in FIG. 12E, the conductive paste 63' and 64' can be formed on the upper main surface of the mother ceramic green sheet 1d' such that the sections thereof are hexagonal shapes and all of the corners of the sections have an obtuse angle.

Subsequently, the mother ceramic green sheets 1a' to 1f' including the mother ceramic green sheet 1d' on which the conductive paste 63' and 64' is formed are stacked, pressed in the vertical direction while being heated, and integrally formed as in the manufacturing method according to the first embodiment to manufacture an unfired mother multilayer body 700'.

Subsequently, the wiring substrate 700 is completed in the same manner as the manufacturing method according to the first embodiment.

Eighth Embodiment

Figure 13:
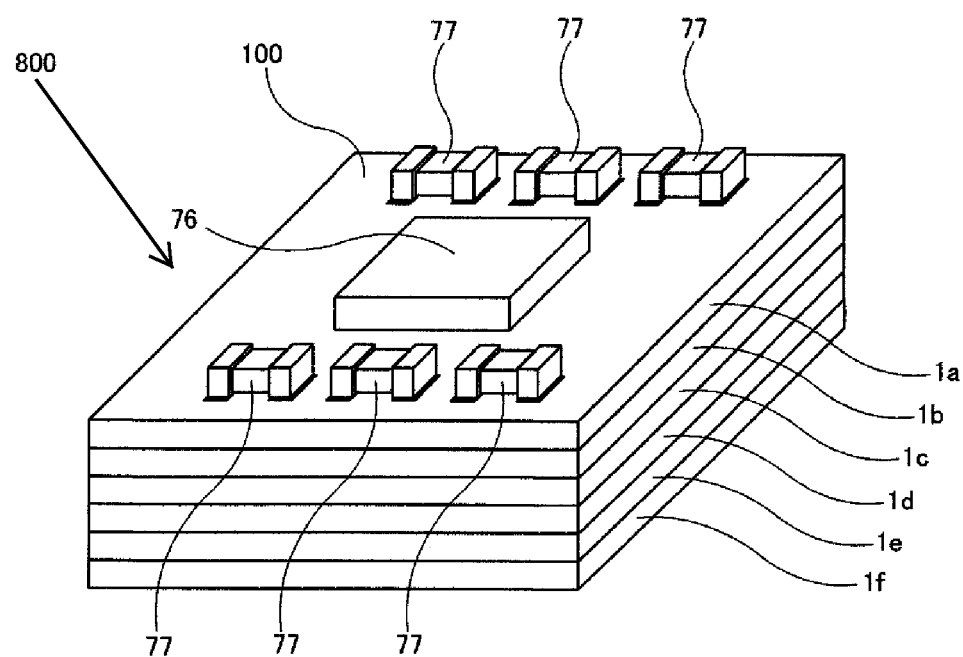
FIG. 13 is a perspective view of an electronic module 800 according to an eighth embodiment.
Figure 14:
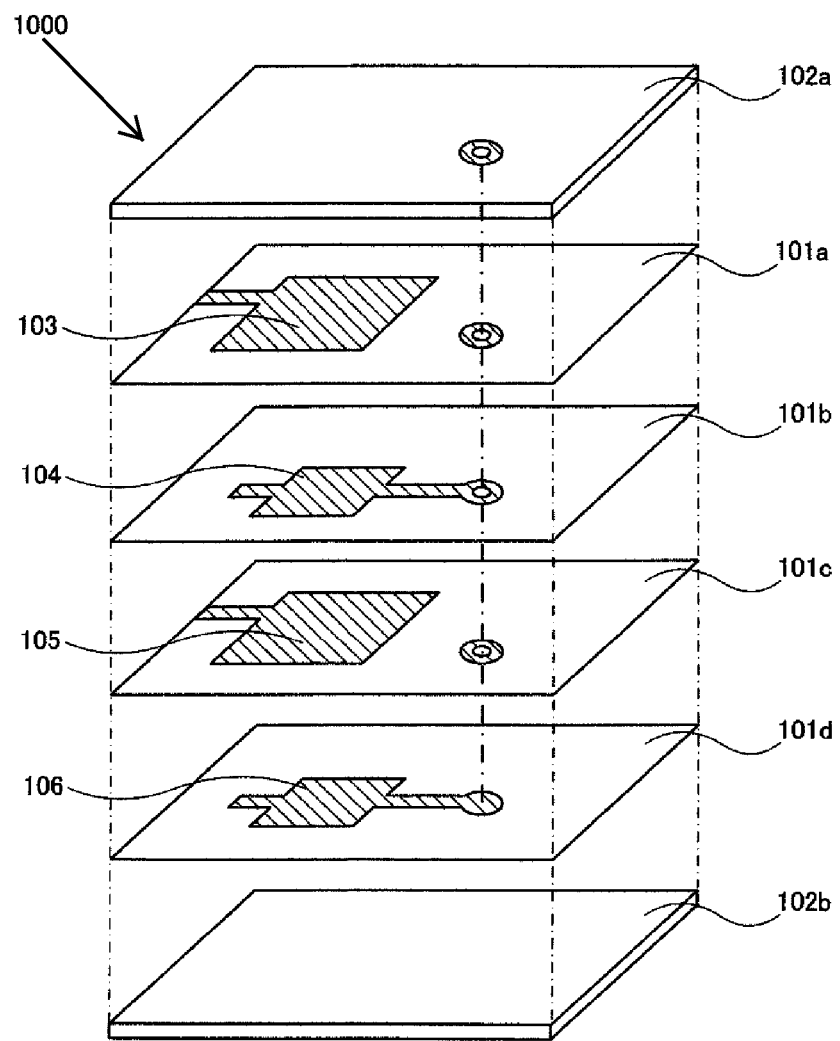
FIG. 14 is an exploded perspective view of a wiring substrate 1000 disclosed in Patent Document 1.

FIG. 13 illustrates an electronic module 800 according to an eighth embodiment. FIG. 13 is a perspective view of the electronic module 800.

The electronic module 800 is manufactured by mounting a semiconductor device 76 and passive components 77 such as a capacitor, an inductor, and a resistor on the land electrodes 2 of the wiring substrate 100 according to the first embodiment.

The electronic module 800 uses the wiring substrate 100 according to the first embodiment and prevents the electrical characteristics from varying even when the undulation occurs in the wiring substrate 100.

The wiring substrates 100, 200, 300, 400, 500, 600, and 700 according to the first embodiment to the seventh embodiment and the electronic module 800 according to the eighth embodiment are described above. The present disclosure, however, is not limited to the above description. Various modifications can be made in accordance with the spirit of the disclosure.

For example, the wiring substrate 100, for example, includes the six insulating layers 1a to 1f. However, the number of the insulating layers is freely determined and can be increased or decreased from six.

Each of the insulating layers 1a to 1f of, for example, the wiring substrate 100 is composed of ceramics. However, the material of each of the insulating layers 1a to 1f is freely determined, and examples thereof may include resin and glass ceramics.

It is suggested that the wiring substrate 100, for example, can contain an inductor and a capacitor. However, a function therein is not limited to the inductor and the capacitor and may be a resistor.

REFERENCE SIGNS LIST 1a to 1f . . . insulating layer
2 . . . land electrode
3, 13, 23, 33, 43, 53, 63 . . . first electrode
4, 14, 24, 34, 44, 54, 64 . . . second electrode
76 . . . semiconductor device
77 . . . passive component (such as a capacitor, an inductor, and a resistor)
100, 200, 300, 400, 500, 600 . . . wiring substrate
800 . . . electronic module

The invention claimed is:

1. A wiring substrate comprising:
insulating layers that are stacked; and
a first electrode and a second electrode are provided between two layers of the insulating layers, the first electrode being spaced apart from the second electrode,
wherein a thickness of the first electrode is larger than a thickness of the second electrode,
a lower main surface of the first electrode is located at a position lower than a lower main surface of the second electrode, and an upper main surface of the first electrode is located at a position higher than an upper main surface of the second electrode in a stacking direction of the insulating layers when seen through in a direction perpendicular to the stacking direction of the insulating layers,
the first electrode is an inductor or a wiring,
the second electrode is a capacitor or a ground,
an area of the upper main surface of the second electrode is larger than an area of the upper main surface of the first electrode when seen through in a direction parallel to the stacking direction of the insulating layers,
the first electrode has a U-shape comprising three sides and one opening when seen through in the direction parallel to the stacking direction of the insulating layers,
the second electrode has a polygonal shape when seen through in the direction parallel to the stacking direction of the insulating layers, and
the three sides of the first electrode surrounds the second electrode when seen through in the direction parallel to the stacking direction of the insulating layers.

2. The wiring substrate according to claim 1, wherein each of the insulating layers is composed of ceramics.

3. The wiring substrate according to claim 1, wherein a sectional shape of the first electrode, or the second electrode, or both is a polygonal shape that has corners when seen through in the direction perpendicular to the stacking direction of the insulating layers, and
wherein all of the corners have an obtuse angle.

4. An electronic module comprising: an electronic component that is mounted on the wiring substrate according to claim 1.

5. The wiring substrate according to claim 1, wherein an area of a surface of the first electrode facing the second electrode is larger than an area of a surface of the second electrode facing the first electrode when seen in a direction perpendicular to the stacking direction of the insulating layers and in a direction in which the first electrode and the second electrode are aligned.

6. The wiring substrate according to claim 1, wherein a total outer area of the first electrode is larger than a total outer area of the second electrode.

7. The wiring substrate according to claim 1, wherein a total outer area of the second electrode is larger than a total outer area of the first electrode.

8. The wiring substrate according to claim 2, wherein a sectional shape of the first electrode, or the second electrode, or both is a polygonal shape that has corners when seen through in the direction perpendicular to the stacking direction of the insulating layers, and
wherein all of the corners have an obtuse angle.

9. A wiring substrate comprising:
insulating layers that are stacked; and
a first electrode and a second electrode are provided between two layers of the insulating layers, the first electrode being spaced apart from the second electrode,
wherein a thickness of the first electrode is larger than a thickness of the second electrode,
a lower main surface of the first electrode is located at a position lower than a lower main surface of the second electrode, and an upper main surface of the first electrode is located at a position higher than an upper main surface of the second electrode in a stacking direction of the insulating layers when seen through in a direction perpendicular to the stacking direction of the insulating layers,
the first electrode is an inductor or a wiring,
the second electrode is a capacitor or a ground,
the first electrode has a U-shape comprising three sides and one opening when seen through in a direction parallel to the stacking direction of the insulating layers,
the second electrode has a polygonal shape when seen through in the direction parallel to the stacking direction of the insulating layers, and
the three sides of the first electrode surrounds the second electrode when seen through in the direction parallel to the stacking direction of the insulating layers.

10. The wiring substrate according to claim 9, wherein an area of the upper main surface of the first electrode is larger than an area of the upper main surface of the second electrode when seen through in the stacking direction of the insulating layers.

11. The wiring substrate according to claim 10, wherein a sectional shape of the first electrode, or the second electrode, or both is a polygonal shape that has corners when seen through in the direction perpendicular to the stacking direction of the insulating layers, and
wherein all of the corners have an obtuse angle.

* * * * *